(12) United States Patent
Furutani et al.

(10) Patent No.: US 6,781,900 B2
(45) Date of Patent: Aug. 24, 2004

(54) SEMICONDUCTOR MEMORY DEVICE WITH ENHANCED RELIABILITY

(75) Inventors: Kiyohiro Furutani, Hyogo (JP); Takeshi Hamamoto, Hyogo (JP); Takashi Kubo, Hyogo (JP); Shigehiro Kuge, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/234,256

(22) Filed: Sep. 5, 2002

(65) Prior Publication Data

US 2003/0174566 A1 Sep. 18, 2003

(30) Foreign Application Priority Data

Mar. 12, 2002  (JP) ............................... 2002-066720

(51) Int. Cl.[7] .................................. G11C 29/00
(52) U.S. Cl. .............................. 365/201; 365/225.7
(58) Field of Search ................ 365/201, 200, 365/225.7, 189.07

(56) References Cited

U.S. PATENT DOCUMENTS 6,259,639 B1 * 7/2001 Hashizume ............... 365/201
6,639,854 B2 * 10/2003 Hur et al. .................. 365/200

FOREIGN PATENT DOCUMENTS

| JP | 8-321197 | 12/1996 |
| JP | 10-62477 | 3/1998 |
| JP | 2001-13224 | 1/2001 |

* cited by examiner

Primary Examiner—Tan T. Nguyen
(74) Attorney, Agent, or Firm—McDermott, Will & Emery

(57) ABSTRACT

The semiconductor memory device has a formal mode and a test mode as operating modes. The program circuit includes a fuse element in which an address using a spare memory cell instead of a defective memory cell is programmed. The program circuit confirms a disconnection state of a fuse in a condition severer in the test mode than that in the normal mode. An anomaly is notified to outside by a detection circuit in a case where results are different between the test mode and the normal mode. In a case where a fuse is not completely blown, such a fuse can also be detected in the test mode to exclude a defective chip.

10 Claims, 15 Drawing Sheets

SEMICONDUCTOR MEMORY DEVICE WITH ENHANCED RELIABILITY

BACKGROUND OF THE INVENTION

1. Field of the Invention

The present invention relates to a semiconductor memory device, and more particularly, to a semiconductor memory device with enhanced reliability.

2. Description of the Background Art

FIG. 15 is a schematic block diagram showing a configuration of a prior art semiconductor memory device 502.

In FIG. 15, there is shown, for simplification of description, a configuration including normal memory cells arranged in a matrix of 256 rows and 256 columns and in addition, one redundant memory cell column for improving a yield. In reality, however, normal cells are arranged in a matrix of a more number of rows and a more number of columns and furthermore, a plural number of columns of redundant memory cells are also provided in more of cases. Moreover, while in FIG. 15, one input/output terminal is shown, there is actually provided a configuration adapted to 4, 8 or 16 input/output terminals.

Referring to FIG. 15, semiconductor memory device 502 includes: a memory cell array 16 having plural memory cells MC arranged in a matrix; and a control circuit 508 receiving an address signal ADD, a clock signal CLK, control signals /RAS, /CAS, /WE, /CS and /CKE to output internal control signals CDE, CADE, a column address CA0 to CA7, a row address RA0 to RA7, a reset signal φ1 and a test signal TEST. Control circuit 508 includes a mode register 509 holding an operating mode of semiconductor memory device 502.

Memory cell array 16 includes: memory cells MC arranged in a matrix, word lines WL0 to WL255 provided correspondingly to respective rows of memory cells MC; and bit line pairs BLP0 to BLP255 provided correspondingly to respective columns of memory cells MC.

Semiconductor memory device 502 further includes: an X decoder 10 decoding row address RA0 to RA7 given from control circuit 508 to selectively drive word lines WL0 to WL255. X decoder 10 includes word drivers each driving a row (a word line) in memory cell array 16 designated by an internal address to a selected state.

Semiconductor memory device 502 further includes: a program circuit 524 receiving reset signal φ1 corresponding to an address signal to output signals FCA and /FCA; a comparator 526 comparing column address CA0 to CA7 and signals FCA and /FCA with each other to output a signal SCE; a Y decoder 12 activated in response to control signal CDE and signal SCE to decode column address CA0 to CA7 and to select one of column select lines CSL0 to CSL255; and a spare Y decoder 28 selecting a spare column select line SCSL in response to signal SCE.

Semiconductor memory device 502 further includes: a multiplexer 18 selecting a bit line designated by column select lines CSL0 to CSL255 and spare column select line SCSL for supplying/receiving data to/from outside; an input circuit 22 receiving a signal DQ given from a terminal to transmit signal DQ to multiplexer 18; and an output circuit 520 outputting data read out from memory cell array 16 through multiplexer 18 to a terminal as signal DQ.

Next, description will be given of an outline of operation thereof.

In a case where a defective memory cell is to be accessed among normal memory cells, a redundant memory cell is accessed instead.

X decoder 10 selects one row among 256 rows according to address signal of 8 bits. Y decoder 12 selects one column among 256 columns according to address signal CA0 to CA7 of 8 bits. A defective column address is programmed in program circuit 524. Comparator 526 compares an inputted address signal and a programmed defective column address with each other. If the inputted address signal coincide with the defective column address, signal SCE assumes H level to cause Y decoder 12 to be non-operable and spare Y decoder 28 activates spare column select line SCSL.

On the other hand, if the inputted address signals do not coincide with the defective column address, Y decoder 12 selects a column according to address signal CA0 to CA7.

FIG. 16 is a circuit diagram showing a configuration of a portion corresponding to one bit of program circuit 524.

Referring to FIG. 16, program circuit 524 includes: a fuse element 530 one end of which is coupled to power supply potential; a P-channel MOS transistor 532 the source of which is connected to the other end of fuse element 530, and receiving reset signal φ1 at the gate thereof; an N-channel MOS transistor 534 connected between the drain of P-channel MOS transistor 532 and ground node and receiving reset signal φ1 at the gate thereof; an inverter 536 having an input connected to the drain of P-channel of MOS transistor 532 and outputting signal FCA; and an inverter 538 feeding back an output of inverter 536 to the input thereof.

When reset signal φ1 assumes H level, signal FCA is set to H level.

When reset signal φ1 assumes L level, signal FCA stays at H level as is if fuse element is disconnected while assuming L level unless fuse element 530 is disconnected. Accordingly, fuse element 530 has only to be disconnected in order to set signal FCA to H level.

FIG. 17 is a view for describing a shape of a fuse element.

Referring to FIG. 17, fuse elements F1 to F3 are made from an aluminum interconnection layer or a polysilicon layer. By irradiating a fuse element F2 with a laser beam in a circle written with a broken line in the figure, the fuse element F2 can be selectively blown.

In a case where a pitch d of fuses is reduced in order to shrink a chip size of a semiconductor memory device, however, requirements arise that a spot diameter of a laser beam is decreased or a strength of the laser beam is reduced in order to prevent blowing as far as adjacent fuses F1 and F3 from occurring.

With a smaller spot diameter of a laser beam or a reduced strength of a laser beam, a possibility occurs that fuse element F2 is not completely disconnected even when fuse element F2 is irradiated with the laser beam for programming fuse elements such that signal FCA is set to H level.

If a defect address is not correctly programmed, a semiconductor memory device does not operate normally, so improvement on yield is not realized even if saving is specially performed using a redundant memory cell. Especially, in a case where a fuse element is not completely disconnected to leave disconnected part thereof behind such that signal FCA shows an intermediate logical level between H level and L level, even if a semiconductor memory device with such a fuse element therein assumes a desired H level of signal FCA in a shipping test to then, operate normally, there is a possibility that signal FCA shows L level at a later chance, in which case there occurs a fear of malfunction of the semiconductor memory device since no replacement with a spare column has been implemented normally.

Accordingly, there has been a problem that, in actuality, a fuse pitch d of FIG. 17 cannot be narrower, resulting in an increase in size of a semiconductor memory device.

SUMMARY OF THE INVENTION

It is an object of the resent invention to provide a semiconductor memory device with enhanced reliability, capable of detecting even incomplete disconnection with certainty in a case where a fuse element is not completely disconnected.

The present invention, in summary, is a semiconductor memory device having a normal mode and a test mode as operating modes and includes: a normal memory cell group; a redundant memory cell group; a program circuit; and a detection circuit.

A portion in the normal memory cell group where access is made is designated by an address signal. The redundant memory cell group is used as a substitution for a portion of the normal memory cell group when the portion of the normal memory cell group is defective. The program circuit holds information designating the defective portion in a non-volatile manner, and performs determination on whether or not an address signal designates the defective portion with a first operation in the normal mode, while performing the determination with a second operation in the test mode. The detection circuit detects whether or not the determination result by the program circuit are different between the normal mode and the test mode.

Accordingly, a main advantage of the present invention is that determinations on whether or not an input address coincides with a defective address can be performed in both of the test mode and the normal mode in respective different conditions, thereby enabling exclusion of a chip in which a fuse in an incomplete state exists by adopting a severer condition in the test mode.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Detailed description will be given of embodiments of the present invention below with reference to the accompanying drawings. Note that the same symbols in the figures indicate the same or corresponding constituents.
First Embodiment FIG. 1 is a schematic block diagram showing a configuration of a semiconductor memory device 2 of the present invention.

Figure 1:
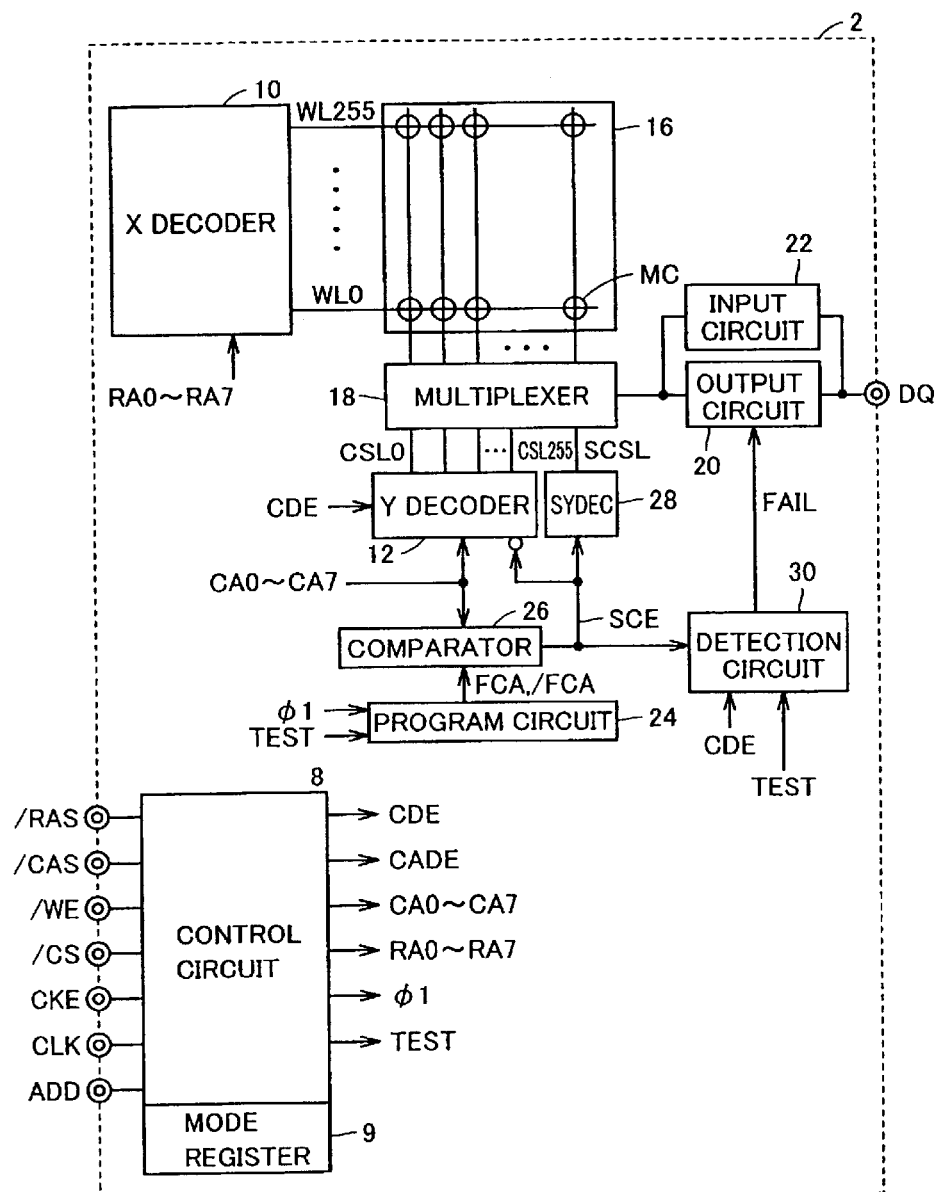
FIG. 1 is a schematic block diagram showing a configuration of a semiconductor memory device 2 of the present invention.

Referring to FIG. 1, semiconductor memory device 2 includes; a memory cell array 16 having plural memory cells MC arranged in a matrix; and a control circuit 8, receiving an address signal ADD, a clock signal CLK, control signals /RAS, /CAS, /WE, /CS and CKE to output internal control signals CDE, CADE, a column address CA0 to CA7, a row address RA0 to RA7, a reset signal $\phi 1$ and a test signal TEST. Control circuit 8 includes a mode register 9 holding an operating mode of semiconductor memory device 2.

Memory cell array 16 includes: memory cells MC arranged in a matrix; word lines WL0 to WL255 provided corresponding to respective rows of memory cells; and bit line pairs BLP0 to BLP255 provided correspondingly to respective columns of memory cells MC.

Semiconductor memory device 2 further includes: an X decoder 10 decoding row address signal RA0 to RA7 given from control circuit 8 to selectively drive word lines WL0 to WL255. X decoder 10 includes word drivers for driving a row (a word line) in memory cell array 16 designated by an internal address to a selected state.

Semiconductor memory device 2 further includes: a program circuit 24 receiving reset signal $\phi 1$ corresponding to an address signal to output signals FCA and /FCA; a comparator 26 comparing column address CA0 to CA7 and signal FCA and /FCA with each other to output signal SCE; a Y decoder 12, activated in response to control signal CDE and signal SCE to decode column address CA0 to CA7 and to select one of column select lines CSL0 to CSL255; and a spare Y decoder 28 selecting a spare column select line SCSL in response to signal SCE.

Semiconductor memory device 2 further includes: a multiplexer 18 selecting a bit line pair designated by column select lines CSL0 to CSL255 and spare column select line SCSL for supplying/receiving data to/from outside; a detection circuit 30 activated in response to control signal CDE and test signal TEST, comparing signal SCE in test mode and signal SCE in normal mode, and outputting a failure signal FAIL; an input circuit 22 receiving signal DQ given from a terminal to transmit the signal to multiplexer 18; and an output circuit 20 outputting data read out from memory cell array 16 through multiplexer 18 to a terminal as signal DQ.

Output circuit 20 is set in a non-operable state where failure signal FAIL is at H level.

Figure 2:
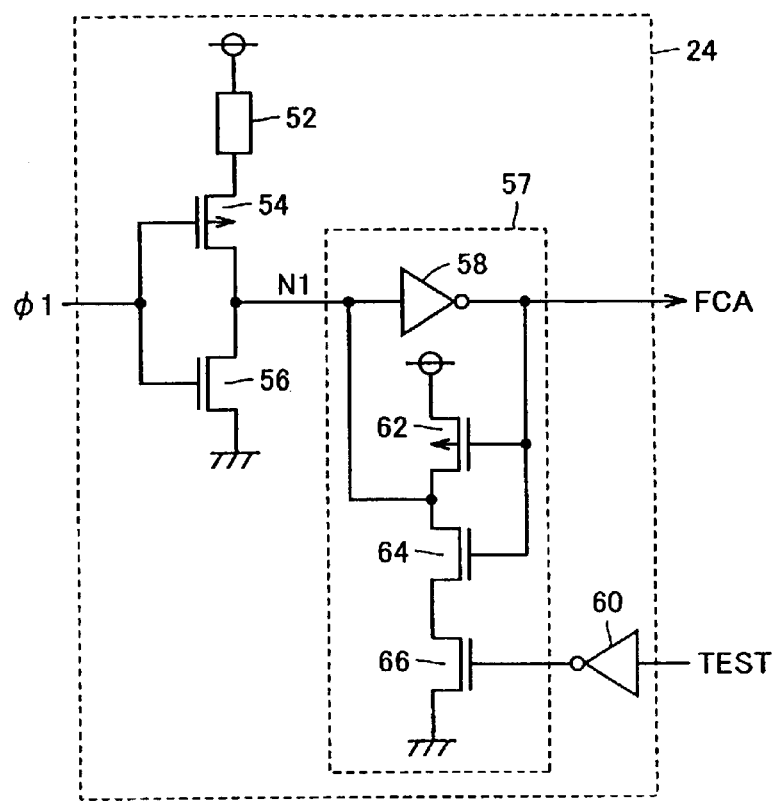
FIG. 2 is a circuit diagram showing a one bit portion of a program circuit 24 in FIG. 1.

FIG. 2 is a circuit diagram showing a portion corresponding to one bit of program circuit 24 in FIG. 1.

Referring to FIG. 2, program circuit 24 includes: a fuse element 52 whose one end is coupled to power supply voltage; a P-channel MOS transistor 54 connected between the other end of fuse element 52 and a node N1, and receiving reset signal $\phi1$ at the gate thereof; an N-channel MOS transistor 56 connected between node N1 and ground node, and receiving reset signal $\phi1$ at the gate thereof; an inverter 60 receiving test signal TEST to invert; and a latch circuit 57 latching a potential at node N1 to output signal FCA.

Latch circuit 57 includes: an inverter 58 having an input connected to node N1 and outputting signal FCA; a P-channel MOS transistor 62, connected between power supply node and node N1, and receiving signal FCA at the gate; and N-channel MOS transistors 64 and 66, connected in series between node N1 and ground node. N-channel MOS transistor 64 receives signal FCA at the gate. N-channel MOS transistor 66 receives an output of inverter 60 at the gate thereof.

Figure 3:
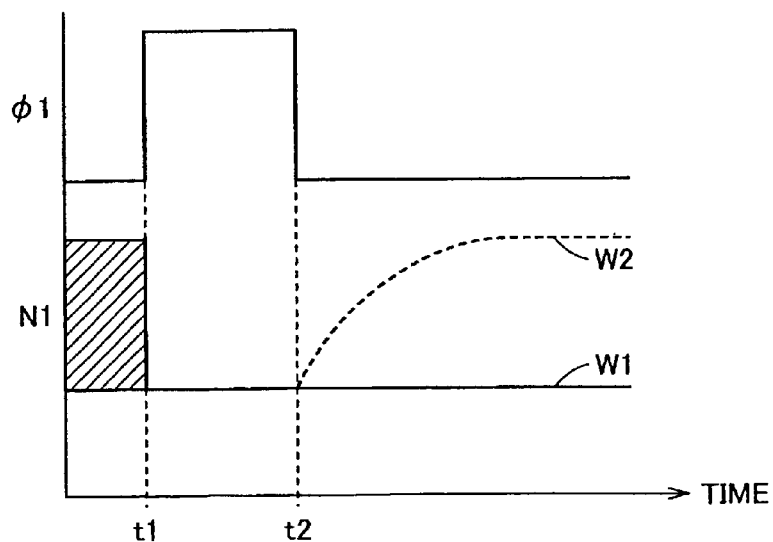
FIG. 3 is an operating waveform diagram for describing operation in a normal mode and test mode of the program circuit 24 of FIG. 2.

FIG. 3 is an operating waveform diagram for describing operation in a normal mode and test mode of program circuit 24 of FIG. 2.

Referring to FIGS. 2 and 3, first of all, in normal mode, test signal TEST is at L level, inverter 60 outputs H level and N-channel MOS transistor 66 is in conductive state.

Reset signal $\phi1$ is set at H level during a period from time t1 to time t2 and node N1 is connected to ground node by N-channel MOS transistor 56 in a conductive state.

In succession, at time t2, reset signal $\phi1$ is set to L level and N-channel MOS transistor 56 enters a non-conductive state, while P-channel MOS transistor 54 enters a conductive state. At this time, if fuse element 52 has been disconnected, a potential at node N1 stays at L level as is, as in a waveform W1.

Here, even in case where incomplete disconnection occurs in fuse element 52, hold data of latch circuit 57 cannot be inverted with a high resistance of a path from power supply node to node N1 through fuse element 52 and P-channel MOS transistor 54, so node N1 stays at L level as is, as in wave form W1.

In test mode, test signal TEST is at H level, inverter 60 outputs L level and N-channel MOS transistor 66 enters a non-conductive state. In such a situation, since a path connecting node N1 in latch circuit 57 to ground node is cut off, a potential at node N1 rises by charging node N1 as in waveform W2 if incomplete disconnection occurs in fuse element 52. Hence, even though signal FCA is at H level in normal mode, signal FCA is at L level in test mode.

Figure 4:
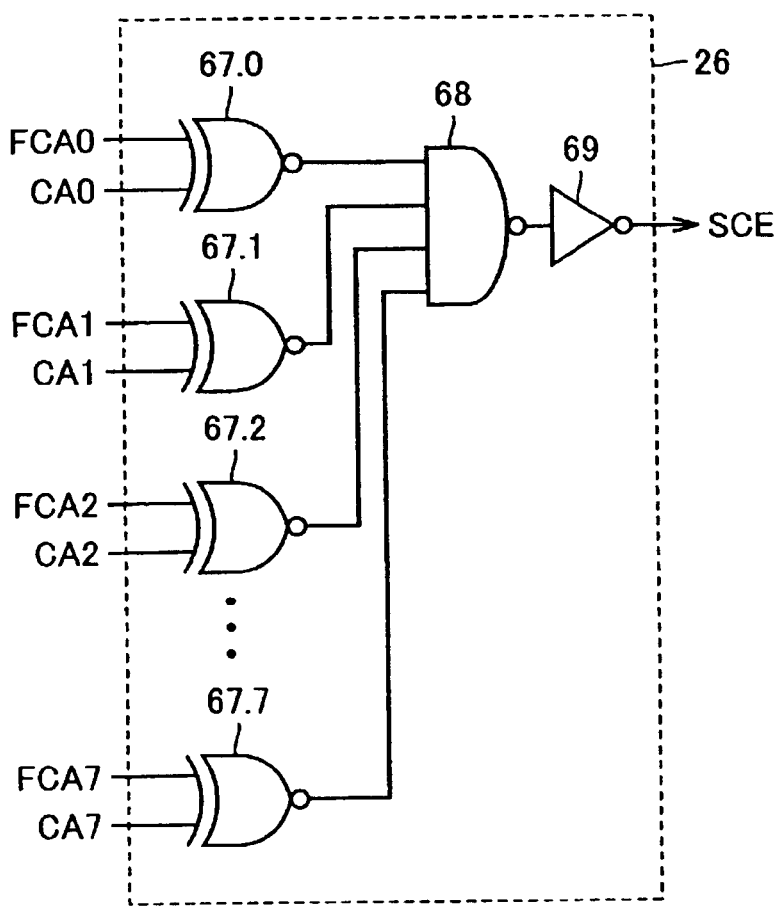
FIG. 4 is a circuit diagram showing a configuration of a comparator 26 in FIG. 1.

FIG. 4 is a circuit diagram showing a configuration of comparator 26 in FIG. 1.

Referring to FIG. 4, comparator 26 compares signal FCAi (i=0 to 7) corresponding to a programmed column address and column address CAi (i=0 to 7) with each other to set signal SCE to H level if corresponding bits all coincide with each other. Signal SCE assumes L level if one pair of the corresponding bits does not coincide with each other.

Comparator 26 includes: exclusive NOR circuits 67.0 to 67.7 comparing signals FCA0 to FCA7 and respective column address CA0 to CA7 with each other; an 8-input NAND circuit 68 receiving outputs of exclusive NOR circuits 67.0 to 67.7; and an inverter 69 inverting an output of NAND circuit 68 to output signal SCE.

Figure 5:
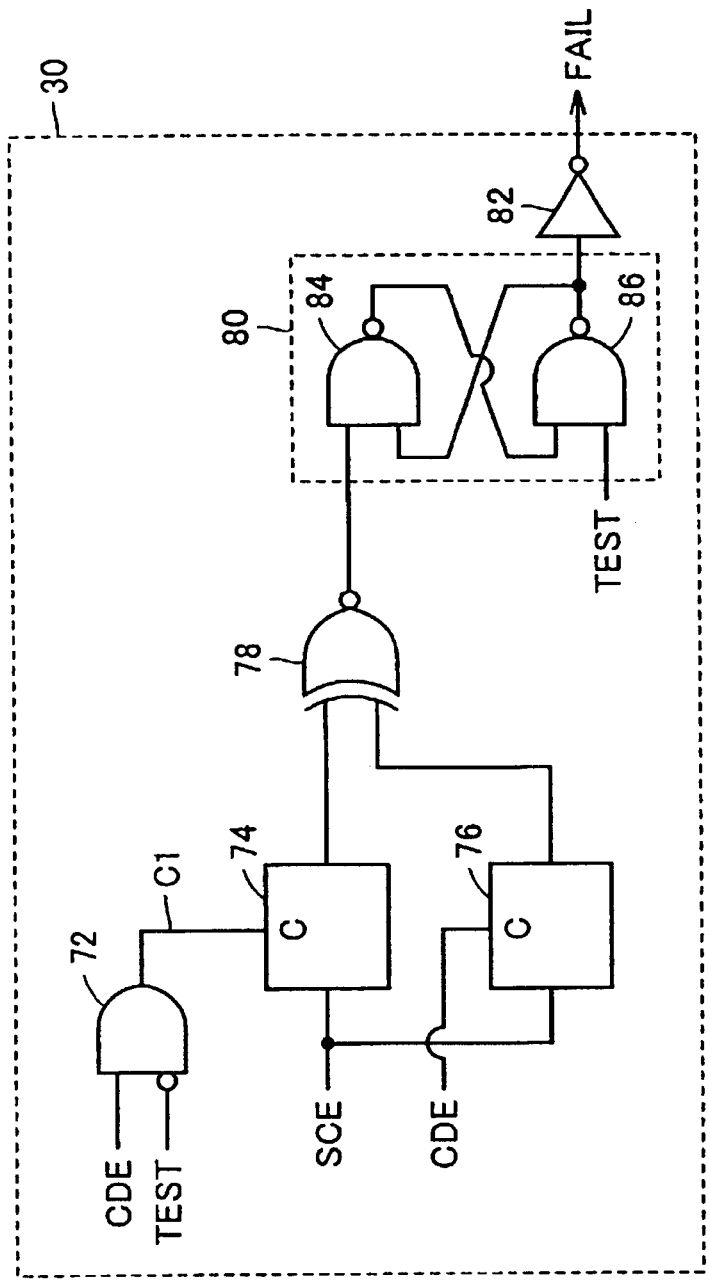
FIG. 5 is a circuit diagram showing a configuration of a detection circuit 30 in FIG. 1.

FIG. 5 is a circuit diagram showing a configuration of detection circuit 30 in FIG. 1.

Referring to FIG. 5, detection circuit 30 includes: a gate circuit 72 detecting a case where control signal CDE is at H level and test signal TEST is at L level to activate signal C1 to H level; a latch circuit 74 latching signal SCE in response to activation of signal C1; a latch circuit 76 latching signal SCE in response to activation of control signal CDE; an exclusive NOR circuit 78 for detecting coincidence between latch data of latch circuits 74 and 76; an SR flip-flop circuit 80 being reset when test signal is deactivated to L level and being set when exclusive NOR circuit 78 outputs L level; and an inverter 82 receiving an output of SR flip-flop circuit 80 to invert the output and output failure signal FAIL.

SR flip-flop circuit 80 includes: a NAND circuit 86 receiving test signal TEST at one input thereof; and a NAND circuit 84 receiving an output of NAND gate 86 and an output of exclusive NOR circuit 78. An output of NAND circuit 84 is given to the other input of NAND circuit 86. An output of NAND circuit 86 is given to the input of inverter 82.

Figure 6:
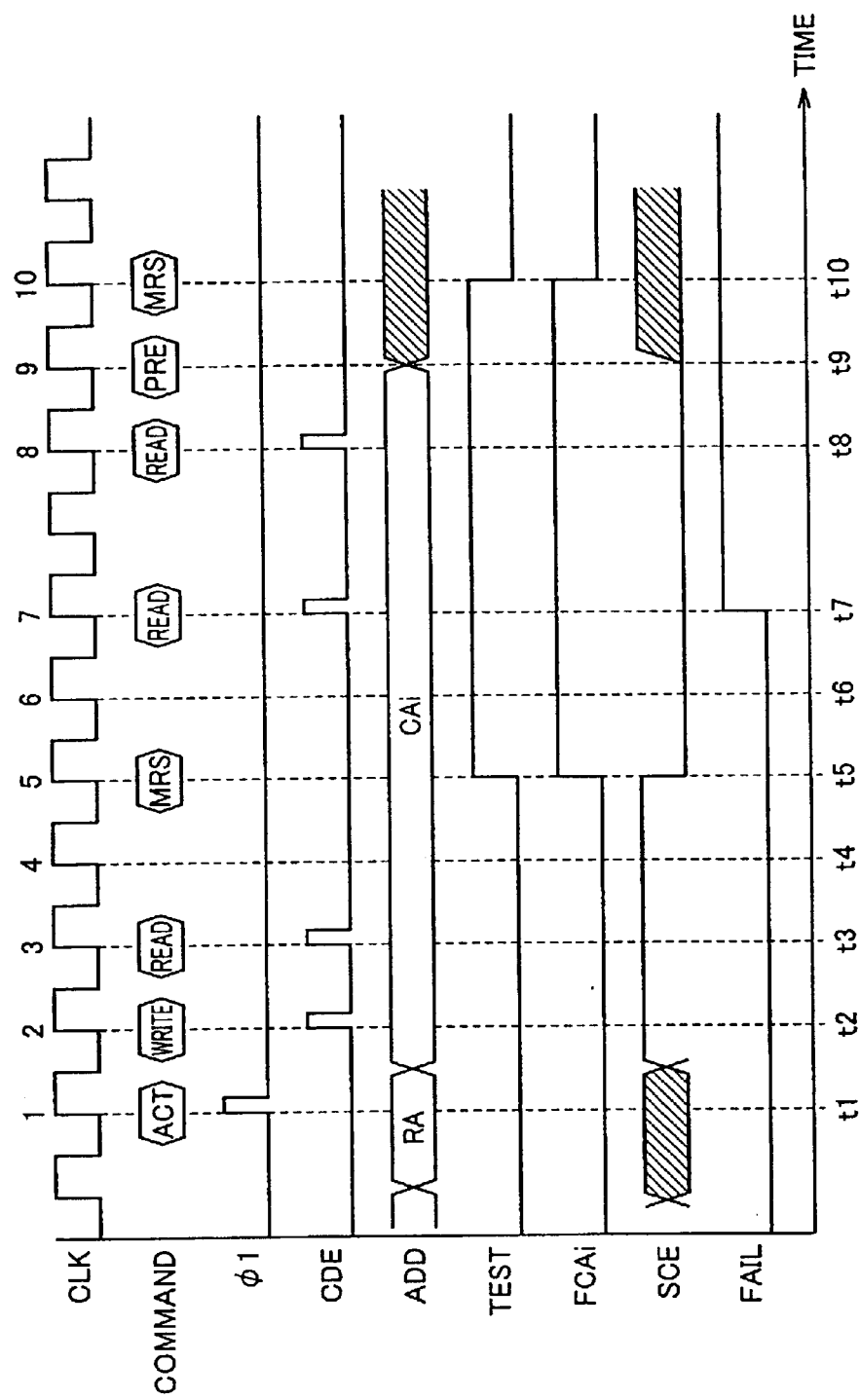
FIG. 6 is an operating waveform diagram showing a procedure of a detection test for incomplete disconnection of a fuse after blowing.

FIG. 6 is an operating waveform diagram showing a procedure of a detection test for incomplete disconnection of a fuse after blowing.

In FIG. 6, there is shown a procedure in which a test is performed in a case where a semiconductor memory device is a synchronous dynamic random access memory (SDRAM), for example.

Referring FIG. 6, at time t1, a command ACT is inputted, and a row is selected by address signal RA. At this time, reset signal $\phi1$ is generated. When reset signal $\phi1$ assumes L level, signal FCAi is generated according to a disconnection state of fuse element.

Next, inputted is column address CAi corresponding to a column of memory cells on which a test is to be performed in the next turn. First of all, at time t2, command WRITE is given, and in succession, at time t3, command READ is given.

At time t2 and t3, since control signal CDE activating Y decoder in response to an inputted command assume H level, signal C1 of FIG. 5 assumes H level and a state of signal SCE activating a spare column is held in latch circuit 74.

Next, at time t5, mode register 9 of FIG. 1 is rewritten by command MRS (mode register set) and test mode is set to drive test signal TEST to H level. Since signal TEST is driven to H level, program circuit 24 of FIG. 2 outputs signal FCA at H level, when incomplete disconnection exists in a fuse element. Then, since signal FCAi and column address signal CAi do not coincide with each other, comparator 26 of FIG. 4 outputs signal SCE at L level.

When, at time t7, command READ is inputted, control signal CDE assumes H level and signal SCE is latched by latch circuit 76 of FIG. 5. Since states of signal SCE are different between test mode and normal mode, an output of the exclusive NOR circuit of FIG. 5 assumes L level to cause failure signal FAIL to be at H level.

By holding a result of the determination in test mode and a result of the determination in normal mode to compare the results with each other, only a chip in which incomplete connection arises in a fuse can also be detected.

When failure signal FAIL is driven to H level, output circuit 20 of FIG. 1 enters a non-operable state; therefore, data written at time t2 cannot be read out even if at time t8, command READ is inputted. Accordingly, it is detectable that there arises incomplete disconnection. Since occurrence of a failure is notified to outside by deactivating an output terminal with a failure signal, the failure can be notified to outside without addition of a new test output terminal.

Finally, at time t10, test mode ends, by command MRS this time.

If a test cycle from time t1 to t10 is repeated by incrementing column address CA7 to CA0 sequentially from (00000000) to (11111111), fuse elements in the entire chip can be checked about whether or not incomplete disconnection exists in each fuse element.

As described above, a semiconductor memory device of the first embodiment determines whether of not an input address coincides with a defect address in each of test mode and normal mode under respective different conditions. Therefore, a severer condition can be adopted in test mode and by excluding a chip having a fuse in an incomplete state, no one among chips passing through the tests performs a wrong determination in normal mode to come later.

To be concrete, by deactivating a feed-back inverter in a latch circuit as shown in FIG. 2 in test mode, a severer condition can be implemented, which enables exclusion of a chip having a fuse in an incomplete state.

Since an anomaly can be detected with more certainty compared with a prior practice in a case of incomplete blowing of a fuse element, a pitch of fuses can be narrowed, thereby enabling a chip size to be reduced.

Second Embodiment

Figure 7:
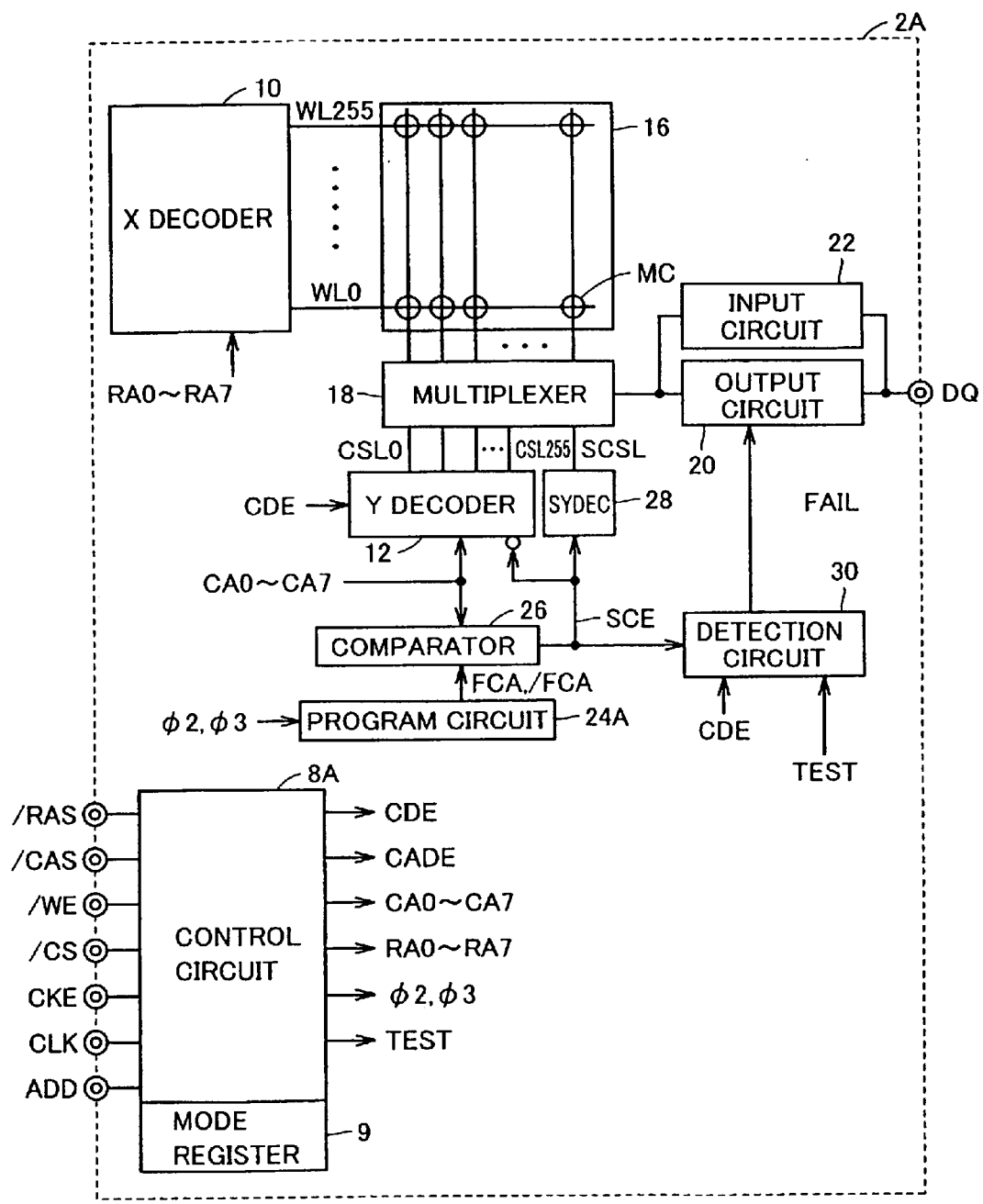
FIG. 7 is a schematic block diagram showing a configuration of a semiconductor memory device 2A of a second embodiment.

FIG. 7 is a schematic block diagram showing a configuration of a semiconductor memory device 2A of a second embodiment.

Referring to FIG. 7, semiconductor memory device 2A has a configuration obtained by replacing control circuit 8 and program circuit 24 with a control circuit 8A and a program circuit 24A respectively in the configuration of semiconductor memory device 2 shown in FIG. 1.

Control circuit 8A outputs signals $\phi 2$ and $\phi 3$ instead of reset signal $\phi 1$. Program circuit 24A receives signals $\phi 2$ and $\phi 3$ and compares signals $\phi 2$ and $\phi 3$ with a defect address programmed in the interior thereof to output signal FCA and /FCA to comparator 26.

Since the other constituents of the configuration are similar to corresponding constituents of the configuration of semiconductor memory device 2 of FIG. 1, none of descriptions thereof is repeated.

Figure 8:
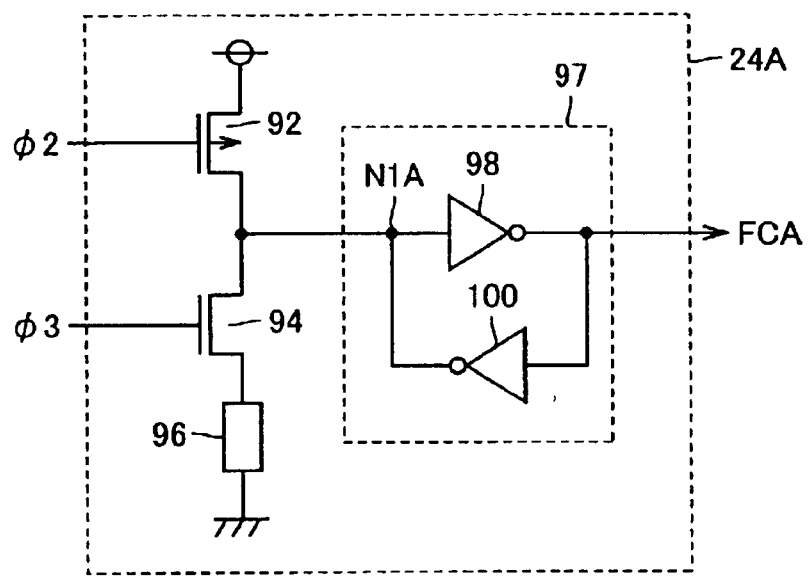
FIG. 8 is a circuit diagram showing a configuration of a program circuit 24A in FIG. 7.

FIG. 8 is a circuit diagram showing a configuration of program circuit 24A in FIG. 7. Program circuit 24A is another example of program circuit 24 of FIG. 2.

Referring to FIG. 8, program circuit 24A includes: a P-channel MOS transistor 92 connected between power supply node and a node N1A, and receiving signal $\phi 2$ at the gate thereof, an N-channel MOS transistor 94 and a fuse element 96 connected in series between node N1A and ground node; and a latch circuit 97 latching a potential at node N1A to output signal FCA. N-channel MOS transistor 94 receives signal $\phi 3$ at the gate thereof.

Latch circuit 97 includes: an inverter 98 having an input connected to node N1A and outputting signal FCA; and an inverter 100 feeding back an output of inverter 98 to node N1A.

Note that a configuration may be adopted that is obtained by adding a transistor similar to N-channel MOS transistor 66 of FIG. 2 to inverter 100 to deactivate it in test mode.

Figure 9:
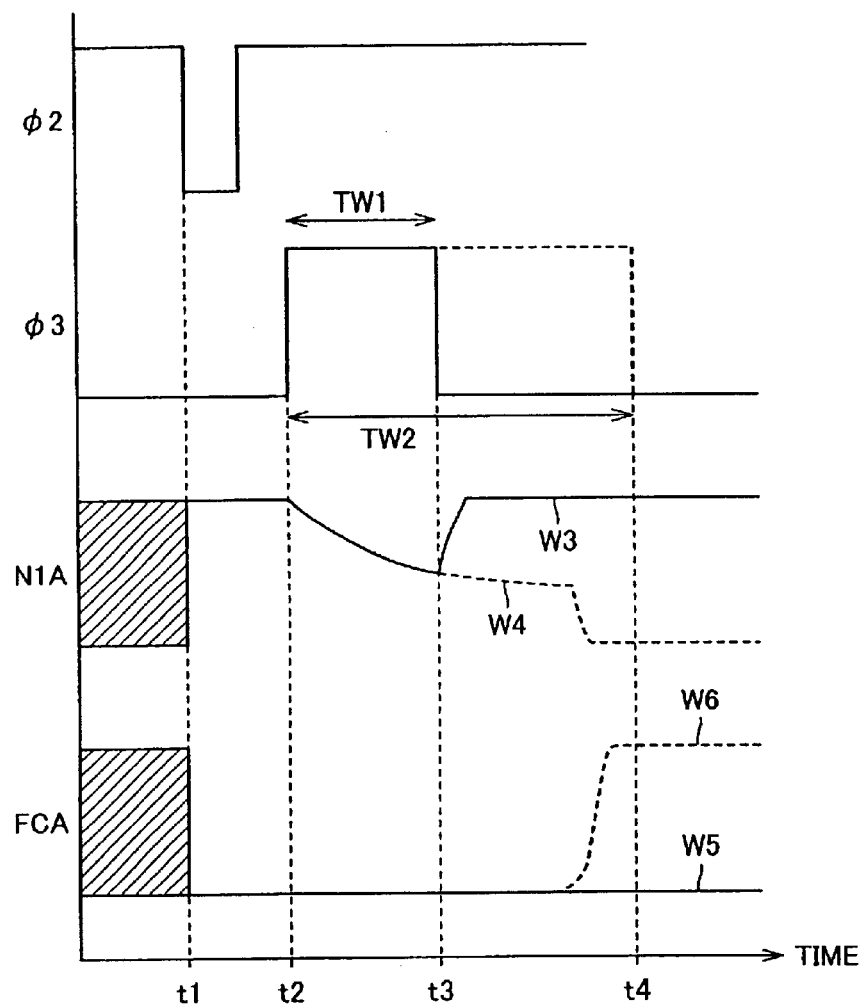
FIG. 9 is an operating waveform diagram for describing operation in program circuit 24A of FIG. 8.

FIG. 9 is an operating waveform diagram for describing operation in program circuit 24A of FIG. 8.

Referring to FIGS. 8 and 9, description will be given, first of all, of a case of complete disconnection of a fuse.

When, at time t1, signal $\phi 2$ assumes L level, node N1A is reset to H level and signal FCA assumes L level.

When, at time t2, signal $\phi 3$ assumes H level, a electric charge of node N1A flows toward ground node through fuse element 96 if a fuse is not disconnected, so signal FCA changes to H level. Accordingly, in order to set signal FCA to L level, fuse element 96 has only to be disconnected.

Next, description will be given of a difference between an operation in normal mode in a case where incomplete disconnection exists in fuse element 96 and an operation in test mode.

In normal mode, at time t1, signal $\phi 2$ is set to L level, a potential at node N1A is initialized to H level, signal $\phi 3$ is set at H level during a period from time t2 to t3, and at time t3 and thereafter signal $\phi 3$ is set to L level. Since fuse element 96 is in an incomplete disconnection state, a resistance value of fuse element 96 is in a high state, thereby causing a time to change a potential at node N1A to L level to be longer.

Therefore, since latch circuit 97 causes a potential at node N1A to be again at H level by feeding back of inverter 100 at time t3, a potential of node N1A behaves as shown by a waveform W3. As a result, signal FCA assumes L level as shown by waveform W5.

On the other hand, in test mode, a pulse with a width TW2 is given as signal $\phi 3$ during a period from time t2 to time t4. With this, since a sufficient time is given to pull down a potential at node N1A, the potential of node N1A is set to L level as shown by waveform W4 and latch circuit 97 holds a potential of node N1A at L level at time t4 and thereafter. As a result, a potential of node N 1A behaves as shown by waveform W4 to cause signal FCA to be set to H level as shown by waveform W6.

If signal FCA assumes L level in a case where a pulse width of signal $\phi 3$ is TW2, signal FCA infallibly assumes L level in a case where a pulse width of signal $\phi 3$ is TW1. Therefore, even if a pulse width is extended from TW1 to TW2 in test mode, no wrong signal is outputted in a case where a fuse remains incompletely disconnected or completely disconnected in normal mode.

Figure 10:
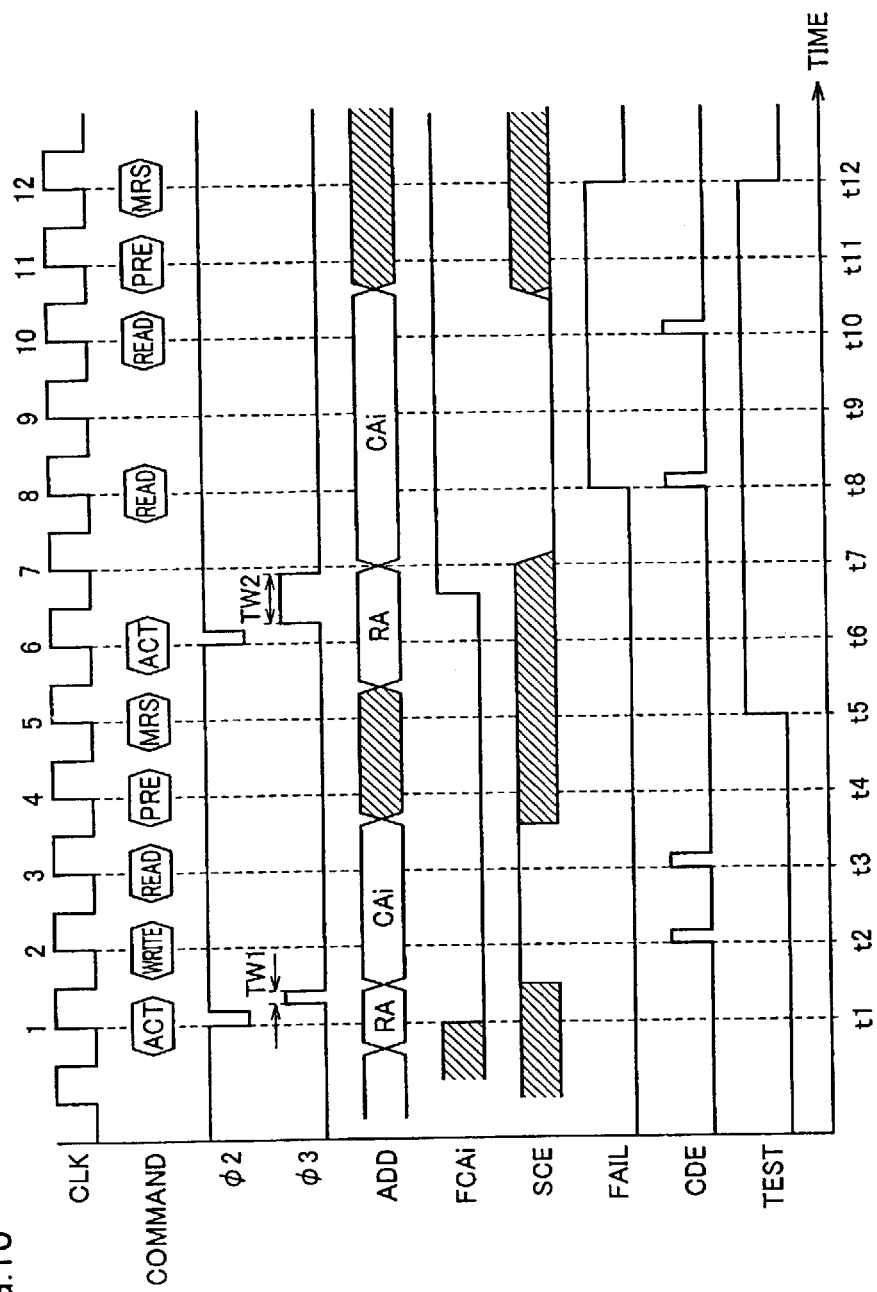
FIG. 10 is an operating waveform diagram for describing a test for detecting that there exists incomplete disconnection of a fuse after blowing.

FIG. 10 is an operating waveform diagram for describing a test for detecting that there exists incomplete disconnection of a fuse after blowing.

Referring to FIG. 10, at time t1, command ACT is inputted and selection of a row is performed according to row address RA. At this time, signal $\phi 2$ is pulsewise activated to L level to initialize signal FCAi to L level.

In succession, when signal $\phi 3$ is activated to H level in a pulse width TW1, signal FCAi according to a state of disconnection of a fuse element is generated.

At time t2, a column address CAi is inputted that corresponds to a column on which a test is to be performed in the next turn. For example, it is assumed that signal FCAi and column address CAi coincide with each other and signal SCE activating a spare column is driven to H level. If at time t2, command WRITE is inputted and at time t3, command READ is inputted, control signal CDE activating Y decoder is driven to H level. Signal C1 of detection circuit 30 of FIG. 5 assumes H level and a state of signal SCE is held in latch circuit 74.

Next, at time t4, command PRE is inputted. This is because at time t6, command ACT is inputted.

In succession, at time t5, setting to test mode is performed by command MRS. Then, signal TEST changes from L level to H level. As described above, when test signal TEST is at H level, control circuit 8A of FIG. 7 alters a pulse width of signal φ3 to TW2.

Therefore, signals φ2 and φ3 are sequentially activated in response to command ACT given at time t6, and signal FCAi changes to H level, which is different from a value in normal mode, if there exists incomplete disconnection in a fuse. In response, at time t7, signal SCE assumes L level since signal FCAi and column address CAi do not coincide with each other.

When, at time t8, command READ is inputted, control signal CDE is activated to H level and signal SCE is held in latch circuit 76.

Since states of signal SCE in normal mode and test mode are different from each other, an output of exclusive NOR circuit of FIG. 5 assumes L level and failure signal FAIL assumes H level.

When failure signal FAIL assumes H level, output circuit 20 of FIG. 1 enters a non-operable state, so even if at time t10, command READ is inputted, data written at time t2 cannot be read out. Therefore, it can be detected that there exists incomplete disconnection is in a fuse element.

At time t12, test mode this time ends by command MRS.

If a test cycle from time t1 to t12 is repeated by incrementing column address CA7 to CA0 sequentially from (00000000) to (11111111), fuse elements in the entire chip can be checked about whether or not incomplete disconnection exists in a fuse element.

In a semiconductor memory device of the second embodiment, as described above, a severer condition can be adopted in test mode by setting an active period of a transistor connected in series with a fuse element differently from that in normal mode, thereby enabling exclusion of a chip having a fuse in an incomplete state.

Third Embodiment

Description is given of a case where disconnection of a fuse element is performed by irradiation with a laser beam in each of the first and second embodiments. In the third embodiment, there is shown a program circuit in a case where a conductive or non-conductive state of a fuse element is electrically controlled.

Figure 11:
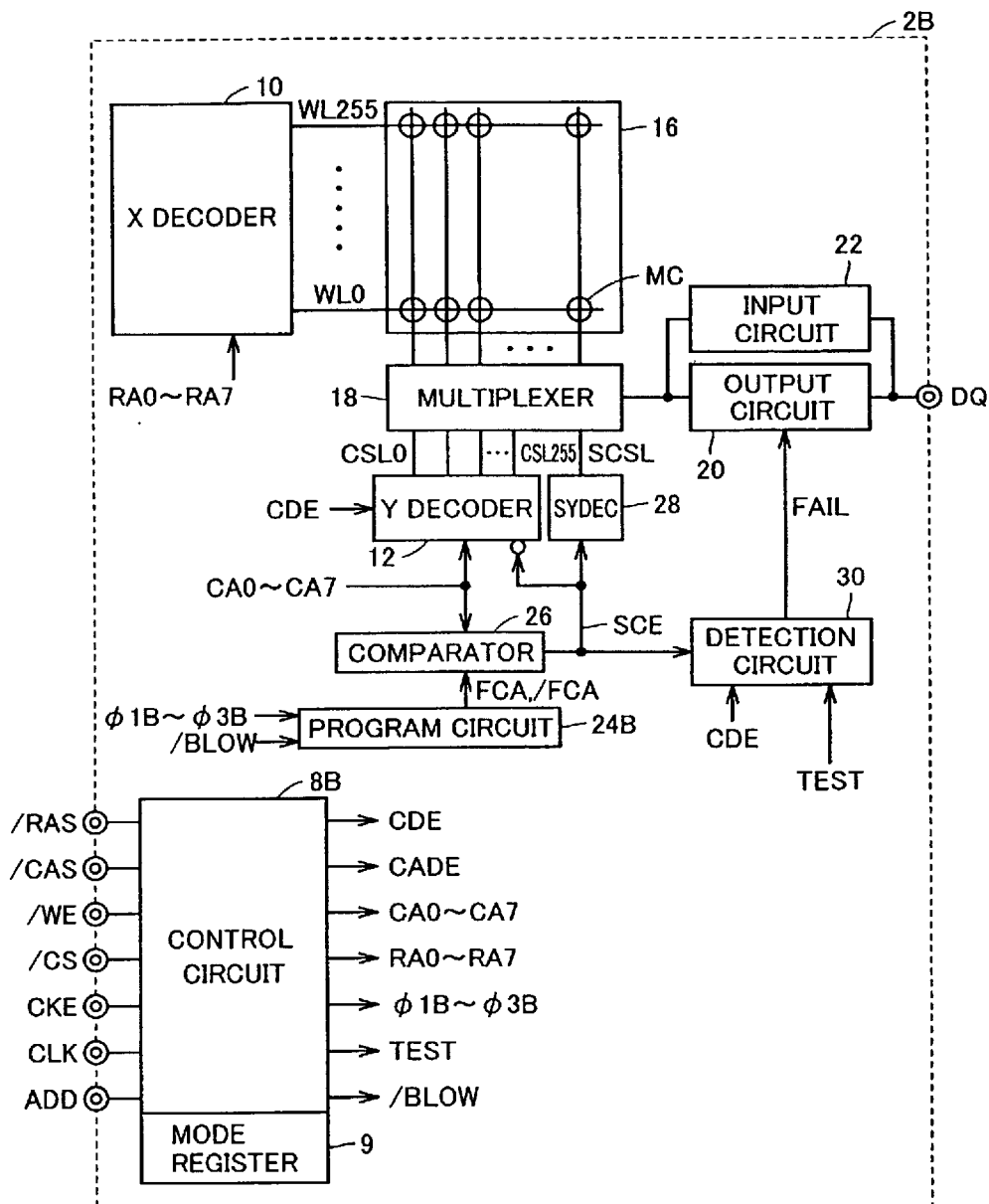
FIG. 11 is a schematic block diagram showing a configuration of a semiconductor memory device 2B of a third embodiment.

FIG. 11 is a schematic block diagram showing a configuration of a semiconductor memory device 2B of a third embodiment.

Referring to FIG. 11, semiconductor memory device 2B has a configuration obtained by replacing control circuit 8 with control circuit 8B and program circuit 24 with a program circuit 24B in that of semiconductor memory device 2 shown in FIG. 1. Control circuit 8B outputs signals φ1B to φ3B instead of reset signal φ1 and further outputs a signal /BLOW for disconnecting a fuse included in program circuit 24B.

Figure 12:
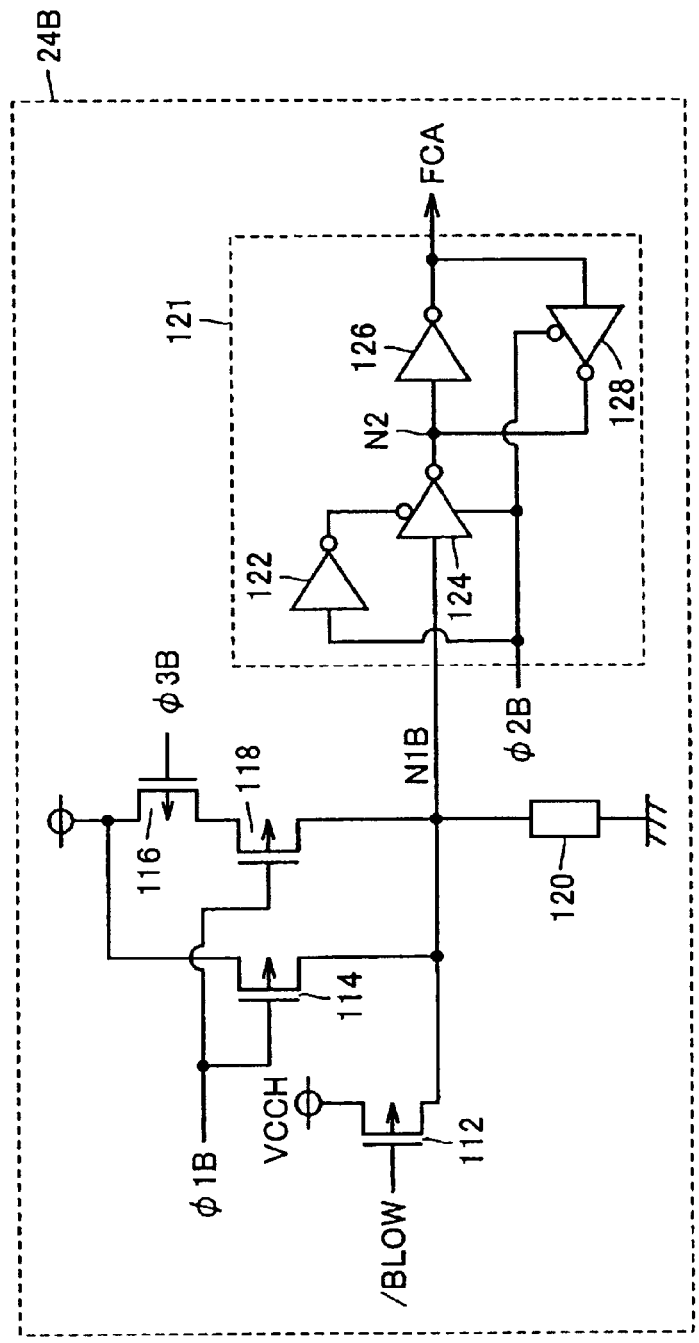
FIG. 12 is a circuit diagram showing a one bit portion of a program circuit 24B in FIG. 11.

FIG. 12 is a circuit diagram showing a portion corresponding to one bit of program circuit 24B in FIG. 11.

Referring to FIG. 12, program circuit 24B includes: a P-channel MOS transistor 112, having a source coupled to power supply potential VCCH for fuse blowing, having a drain connected to a node N1B, and receiving signal/BLOW; a P-channel MOS transistor 114, connected between power supply node and node N1B, and receiving signal φ1B at the gate thereof; and P-channel MOS transistors 116 and 118 connected in series between power supply node and node N1B. P-channel MOS transistors 116 and 118 receive signals φ3B and φ1B at the respective gates thereof.

Program circuit 24B further includes: a fuse element 120 connected between node N1B and ground node; and a flip-flop circuit 121 capturing a potential at node N1B in response to signal φ2B.

Flip-flop circuit 121 includes: an inverter 122 receiving signal φ2B to invert the signal; a clocked inverter 124 receiving a potential at node N1B when signal φ2B is at H level to invert the data to output the inverted data to node N2; an inverter 126 having an input connected to node N2 and outputting signal FCA; and a clocked inverter 128 activated when signal φ2B is at L level to feed back an output of inverter 126 to node N2.

Fuse element 120 is formed from an aluminum interconnection layer, a polysilicon interconnection layer, a pn junction, a capacitor with an oxide film as an insulating layer or the like. In a case where a fuse element is formed from an aluminum interconnection layer or a polysilicon interconnection layer, a resistance value of the fuse element increases by application of a voltage. In a case of a pn junction or a capacitor with an oxide film as an insulating layer, application of a voltage across electrodes causes breakdown of a pn junction or breakdown of an oxide film, decreasing a resistance value of the fuse element.

Next, description will be given of a case where a resistance value of a fuse element shows an intermediate value as a result of electrical programming of the fuse element.

Figure 13:
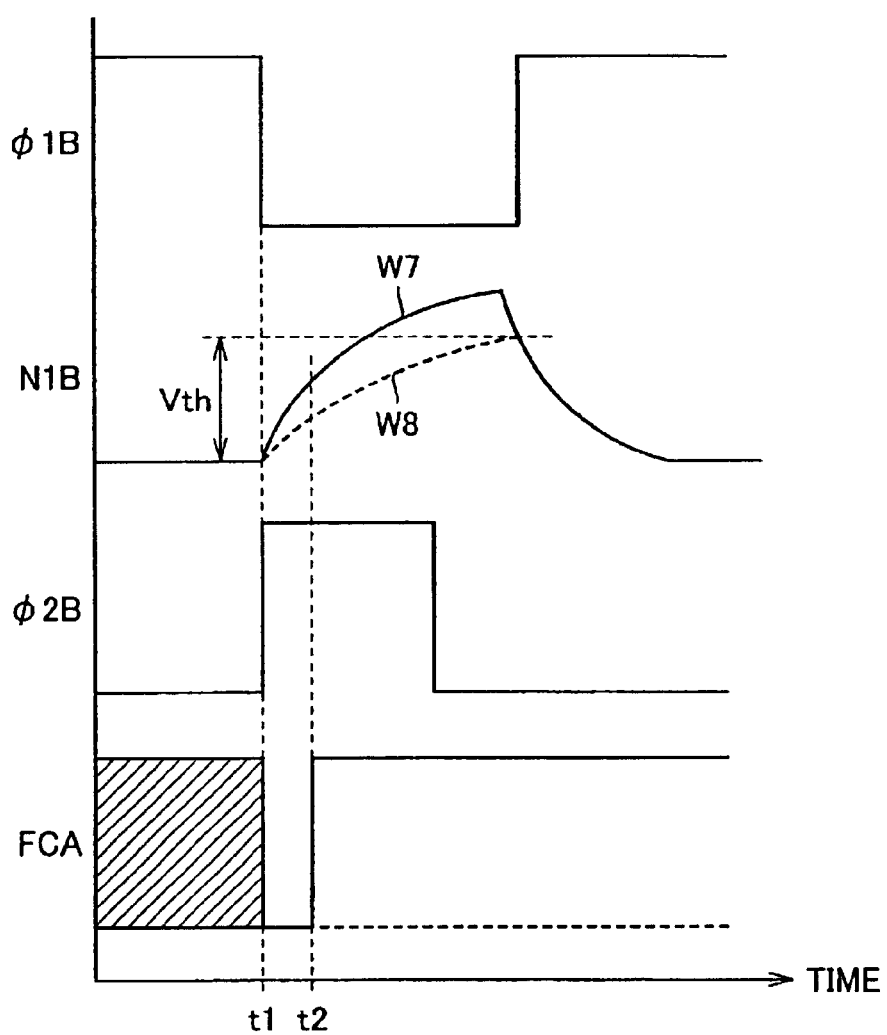
FIG. 13 is an operating waveform diagram for describing a case where a resistance value of a fuse element assumes an intermediate value.

FIG. 13 is an operating waveform diagram for describing a case where a resistance value of a fuse element assumes an intermediate value.

Referring to FIG. 13, at time t1, signal φ1 changes from H level to L level and signal φ2 changes from L level to H level.

When a fuse element is completely disconnected, a charge is performed through P-channel MOS transistor 114 to raise a potential at node N1B as in a waveform W7. Therefore, at time t2, the potential exceeds a threshold voltage Vth of clocked inverter 124; therefore, node N2 is inverted from H level to L level. As a result, signal FCA changes L level to H level.

On the other hand, if fuse element 120 in an incomplete disconnection state with a high resistance value, a potential of node N1B does not exceed the threshold voltage Vth as shown in a waveform W8. Accordingly, signal FCA holds its state at L level.

Here, in program circuit 24B of FIG. 12, there is a second charge path connecting node N1B to power supply potential through P-channel MOS transistors 116 and 118. When signal φ3 is at H level, P-channel MOS transistor 116 is in a non-conductive state and P-channel MOS transistor 114 is one charge path available.

If even in a case where only one charge path is active, node N1B rises to H level and as a result, signal FCA assumes H level, signal FCA also assumes H level even if signal φ3 changes to L level and the second charge path is activated.

On the other hand, if even in a case where signal φ3 is at L level and the second charge path is active, a potential at node N1B is still at L level and as a result signal FCA is at L level. It is considered that signal FCA assumes L level if signal φ3 changes to H level and the second charge path is deactivated.

Therefore, in a case where a fuse element is an element whose resistance value is raised by programming as in an aluminum interconnection layer, a polysilicon interconnection layer or the like, signal φ3 is set to H level in test mode. In this case as well, when a signal outputted by the latch circuit is driven to H level, signal FCA outputted by the latch circuit shows H level in a stable manner if signal φ3 is set to L level in normal mode.

On the other hand, in a case where a pn junction or a capacitor made from an oxide film is used in a fuse element and a resistance value thereof is reduced by programming, signal φ3 is set to L level in test mode. In a case where signal FCA is still at L level in test mode, signal FCA outputted by the latch circuit shows L level in a stable manner if signal φ3 is set to H level in normal mode.

Accordingly, it can be prevented that signal FCA comes to be unstable in normal mode due to incomplete fuse blowing.

Figure 14:
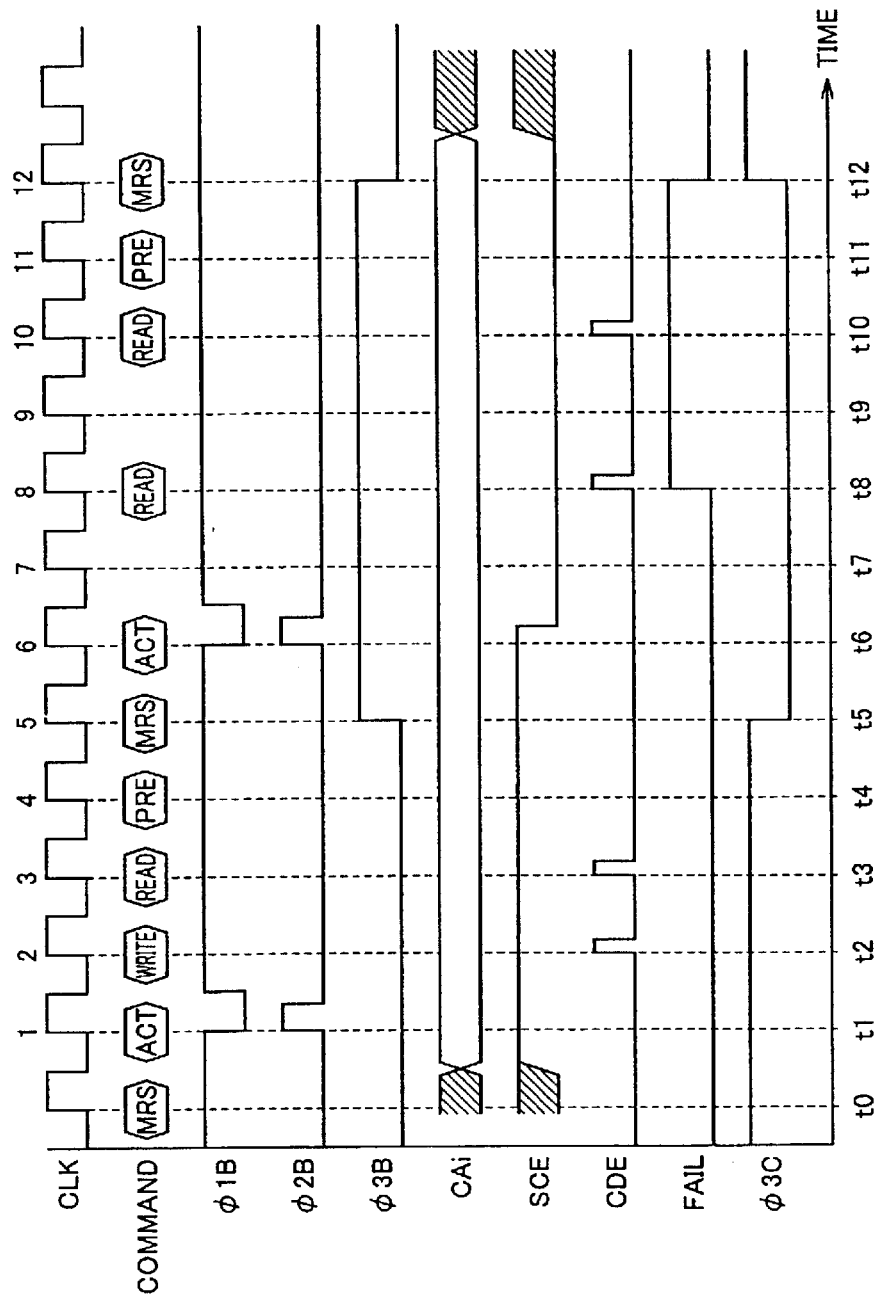
FIG. 14 is an operating waveform diagram for describing a test for detecting a fuse in a incomplete disconnection state in the third embodiment.
Figure 15:
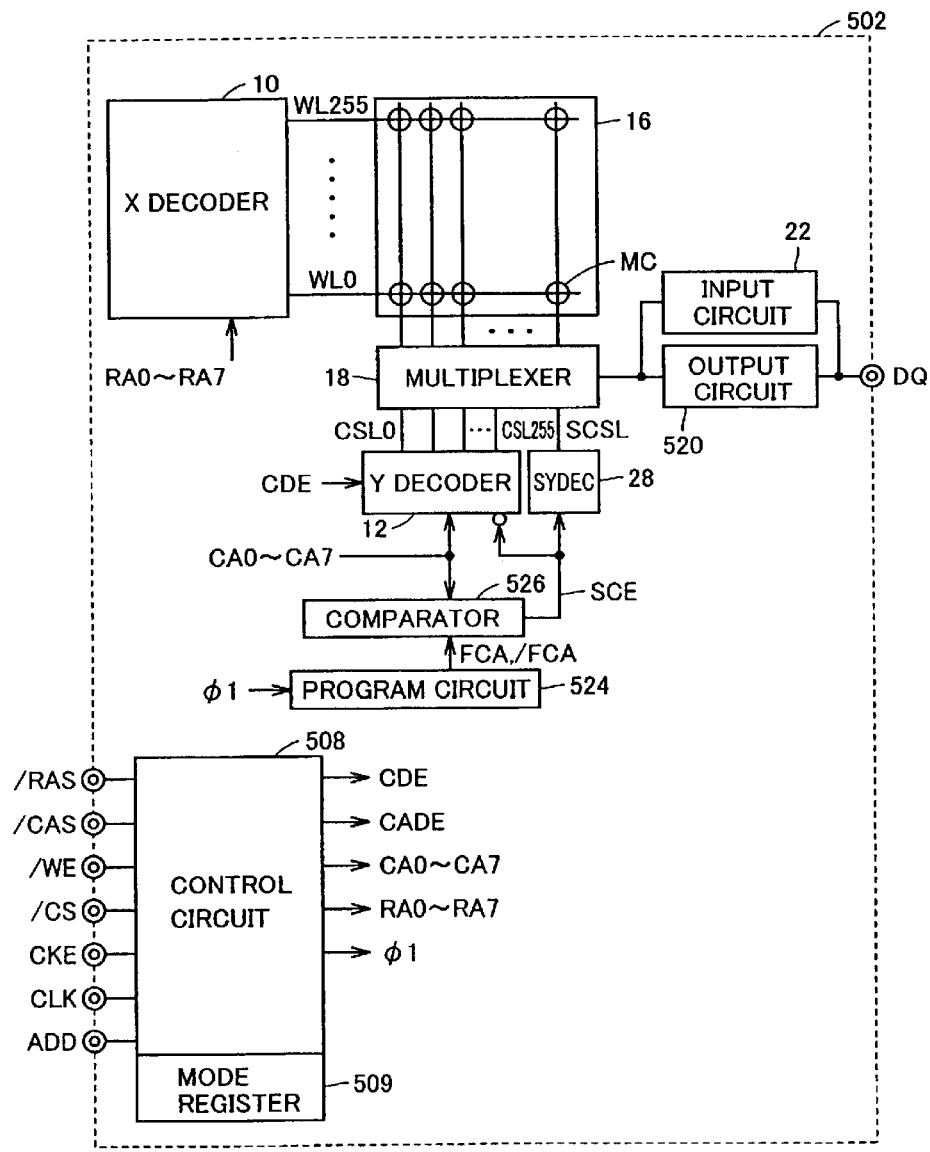
FIG. 15 is a schematic block diagram showing a configuration of a prior art semiconductor memory device 502.
Figure 16:
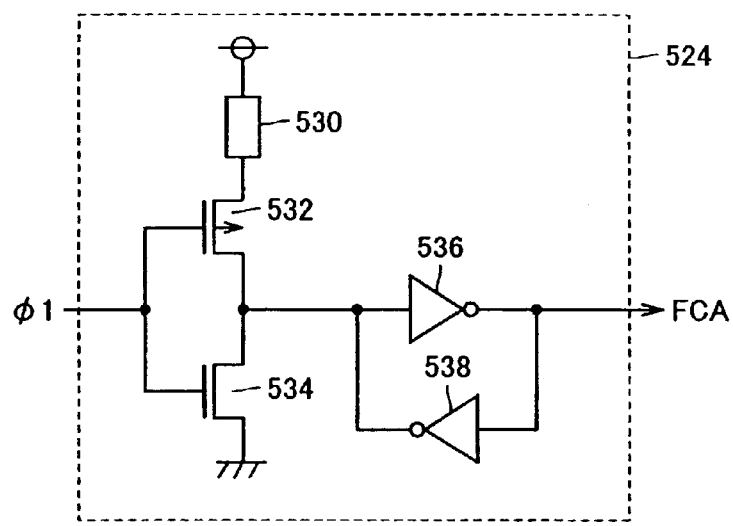
FIG. 16 is a circuit diagram showing a configuration of a portion corresponding to one bit of a program circuit 524.
Figure 17:
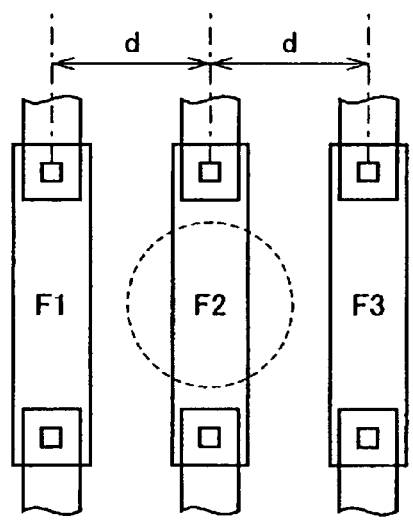
FIG. 17 is a view for describing a shape of a fuse element.

FIG. 14 is an operating waveform diagram for describing a test for detecting a fuse in an incomplete disconnection state in the third embodiment.

Referring to FIG. 14, at time t0, command MRS is inputted and normal mode is set and, as a result, signal φ3B assumes L level. Signal φ3B has such a polarity in a case where a resistance value is raised by programming as in a fuse element made of an aluminum interconnection layer or a polysilicon layer.

At time t1, command ACT is inputted and row selection in the memory cell array is performed. At this time, signal φ1B and φ2B are pulsewise activated to generate signal FCAi according to a state of programming for a fuse.

In succession, inputted is column address, CAi corresponding to a column on which a test is to be performed in the next turn. For example, it is assumed that signal FCAi and column address CAi coincide with each other and signal SCE activating a spare column assumes H level.

When, at times t2 and t3, respective commands WRITE and READ are inputted, signal CDE activating Y decoder assumes H level, so signal C1 of FIG. 5 is driven to H level to hold a state of signal SCE in latch circuit 74.

Next, at time t4, command PRE is inputted. This is a preparation for inputting command ACT at time t6.

At time t7, test mode is set by command MRS and as a result, signal φ3B changes from L level to H level.

When signal φ3B is driven to H level, signal FCA changes to L level if incomplete disconnection exists in the fuse element. Then, since signal FCAi and column address CAi do not coincide with each other, signal SCE activating a spare column assumes L level.

Note that in a case where the fuse element is a pn junction or a capacitor using an oxide film, a resistance value of the fuse element is reduced by breakdown of the junction or the oxide film under application of a voltage. In a case where such a fuse element is used, a signal obtained by inverting a polarity of signal φ3B, as shown in signal φ3C of FIG. 14, has only to be given to the gate of P-channel MOS transistor 116 of FIG. 12. By doing so, when a resistance value of the fuse element is not reduced enough, signal FCA changes to H level. In that case also, signal FCAi and column address signal CAi do not coincide with each other, signal SCA activating a spare column assumes L level.

When, at time t8, command READ is inputted, signal CDE activating Y decoder assumes H level, so signal SCE is held in latch circuit 76 of FIG. 5.

Since states of signal SCE in normal mode and test mode are different from each other, an output of exclusive NOR circuit 78 assumes L level and failure signal FAIL assumes H level.

When failure signal FAIL assumes H level, output circuit 20 of FIG. 7 enters a non-operable state, so data written at time t2 cannot be read out from a semiconductor memory device even if at a time t10, command READ is inputted. Therefore, it can be detected that incomplete disconnection exits in a fuse element.

At time t12, command MRS is inputted to cease test mode this time. If a test cycle from time t1 to t12 is repeated by incrementing column address CA0 to CA7 sequentially from (00000000) to (11111111), fuse elements in the entire chip can be checked about whether or not incomplete disconnection exists in a fuse element.

A semiconductor memory device of the third embodiment, as described above, includes two switches precharging internal nodes. One of the switches is controlled in a severer condition, thereby enabling exclusion of a chip having a fuse in an incomplete state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a normal mode and a test mode as operating modes, comprising:
   a normal memory cell group in which a portion where access is made is designated by an address signal;
   a redundant memory cell group used as a substitution for a defective portion of said normal memory cell group when said defective portion of said normal memory cell group is defective;
   a program circuit holding information designating said defective portion in a non-volatile manner, and performing determination on whether or not said address signal designates said defective portion with a first operation in said normal mode, while performing the determination with a second operation in said test mode; and
   a detection circuit detecting whether or not the determination result by said program circuit are different between said normal mode and said test mode.

2. The semiconductor memory device according to claim 1, wherein
   said program circuit includes
      a fuse element coupling an internal node to a first power supply potential, and
      a latch circuit latching a potential at said internal node, and
   said latch circuit includes
      a first inverter having an input connected to said internal node, and
      a second inverter activated in said normal mode to feed back an output of said first inverter to said internal node, and deactivated in said test mode.

3. The semiconductor memory device according to claim 2, wherein
   said program circuit further includes
      a first transistor connected between said fuse element and said internal node to receive an internal signal according to said address signal at the gate thereof, and
   a second transistor coupled between said internal node and a second power supply potential to be conductive complementarily to said first transistor.

4. The semiconductor memory device according to claim 1, wherein
   said program circuit includes
      a first transistor coupling an internal node to a first power supply potential in response to a first internal signal,
      a fuse element connected in series with said first transistor between said internal node and a node applied with said first power supply potential, and
      a latch circuit latching a potential at said internal node, said semiconductor memory device further comprising a control circuit outputting said first internal signal in response to said address signal, and said control circuit activates said first internal signal during an active period in said test mode, different from an active period in said normal mode.

5. The semiconductor memory device according to claim 4, wherein
said program circuit further includes
a second transistor coupling said internal node to a second power supply potential in response to a second internal signal, and
said control circuit activates said first internal signal after activation of said second internal signal.

6. The semiconductor memory device according to claim 1, wherein
said program circuit includes
a latch circuit latching a potential at an internal node,
a fuse element coupling said internal node to a first power supply potential,
a first switch circuit coupling said internal node to a second power supply potential in response to an internal signal according to said address signal,
a second switch circuit provided in parallel to said first switch circuit, activated in response to a control signal, and coupling said internal node to said second power supply potential in response to said internal signal,
said semiconductor memory device further comprising a control circuit changing a polarity of said control signal between said normal mode and said test mode.

7. The semiconductor memory device according to claim 6, wherein
said first switch circuit includes
a first field effect transistor connected between a node applied with said second power supply potential and said internal node, and receiving said internal signal at the gate thereof, and
said second switch circuit includes
second and third field effect transistors connected in series between a node applied with said second power supply potential and said internal node, and receiving said internal signal and said control signal at the respective gates thereof.

8. The semiconductor memory device according to claim 1, wherein
said detection circuit includes
a first hold circuit holding the determination result by said program circuit in said normal mode,
a second hold circuit holding the determination result by said program circuit in said test mode,
a gate circuit detecting non-coincidence between outputs of said first and second hold circuits, and
a failure signal output circuit deactivating a failure signal in said normal mode, while activating said failure signal according to an output of said gate circuit in said test mode.

9. The semiconductor memory device according to claim 8, wherein
said gate circuit includes an exclusive NOR circuit receiving outputs of said first and second hold circuits.

10. The semiconductor memory device according to claim 8, further comprising
an output circuit ceasing data outputting in response to said failure signal.

* * * * *